United States Patent
Adachi et al.

(10) Patent No.: US 9,601,903 B2
(45) Date of Patent: Mar. 21, 2017

(54) HORIZONTAL CAVITY SURFACE EMITTING LASER DEVICE

(71) Applicant: Oclaro Japan, Inc., Kanagawa (JP)

(72) Inventors: Koichiro Adachi, Tokyo (JP); Takanori Suzuki, Tokyo (JP)

(73) Assignee: Oclaro Japan, Inc., Kanagawa (JP)

( * ) Notice: Subject to any disclaimer, the term of this patent is extended or adjusted under 35 U.S.C. 154(b) by 0 days.

(21) Appl. No.: 14/607,192

(22) Filed: Jan. 28, 2015

(65) Prior Publication Data
US 2015/0214695 A1 Jul. 30, 2015

(30) Foreign Application Priority Data

Jan. 29, 2014 (JP) .................................. 2014-014919

(51) Int. Cl.
*H01S 5/125* (2006.01)
*H01S 5/026* (2006.01)
(Continued)

(52) U.S. Cl.
CPC .............. *H01S 5/0267* (2013.01); *H01S 5/18* (2013.01); *H01S 5/0207* (2013.01);
(Continued)

(58) Field of Classification Search
CPC ........... H01S 5/18; H01S 5/187; H01S 5/0267
(Continued)

(56) References Cited

U.S. PATENT DOCUMENTS

2005/0063640 A1* 3/2005 Uchida ................ G02B 6/3582
385/17
2006/0291516 A1* 12/2006 Aoki .......................... 372/50.11
(Continued)

FOREIGN PATENT DOCUMENTS

JP  2004-235182  *  8/2004
JP  2007-5594      1/2007
(Continued)

OTHER PUBLICATIONS

B. Stegmuller et al., Surface Emitting InGaAsP/InP Distributed Feedback Laser Diode at 1.53 um with Monolithic Integrated Microlens, IEEE Photonics Technology Letters, vol. 3, No. 9, Sep. 1991, pp. 776-778.

*Primary Examiner* — Tod T Van Roy
(74) *Attorney, Agent, or Firm* — Mattingly & Malur, PC

(57) ABSTRACT

A horizontal cavity surface emitting laser device includes an active layer configured to generate light to be emitted in one direction along the one surface of a semiconductor substrate and in another direction opposite to the one direction. The device also includes a rear distributed Bragg reflector unit configured to reflect the light. The rear distributed Bragg reflector unit includes a waveguide layer configured to guide light and a distributed Bragg reflector configured to reflect the light in the waveguide layer. The device further includes an optical component configured to guide, in a direction different from the one direction and the other direction, the light emitted from an end of the rear distributed Bragg reflector unit in the one direction. The device further includes a front reflecting mirror configured to reflect the light emitted from the active layer in the other direction toward another surface side of the semiconductor substrate.

8 Claims, 9 Drawing Sheets

(51) Int. Cl.
*H01S 5/18* (2006.01)
*H01S 5/343* (2006.01)
*H01S 5/0625* (2006.01)
*H01S 5/12* (2006.01)
*H01S 5/02* (2006.01)
*H01S 5/022* (2006.01)
*H01S 5/042* (2006.01)

(52) U.S. Cl.
CPC ........... *H01S 5/0224* (2013.01); *H01S 5/0422* (2013.01); *H01S 5/0425* (2013.01); *H01S 5/06256* (2013.01); *H01S 5/12* (2013.01); *H01S 5/124* (2013.01); *H01S 5/34306* (2013.01)

(58) Field of Classification Search
USPC ...................................... 372/50.1, 50.23, 93
See application file for complete search history.

(56) References Cited

U.S. PATENT DOCUMENTS

2008/0266638 A1* 10/2008 Shinoda ................ B82Y 20/00
359/237
2010/0290489 A1* 11/2010 Agresti et al. .................. 372/26

FOREIGN PATENT DOCUMENTS

JP 2010-045066 2/2010
WO 2005/072224 8/2005

* cited by examiner

HORIZONTAL CAVITY SURFACE EMITTING LASER DEVICE

CROSS-REFERENCE TO RELATED APPLICATION

The present application claims priority from Japanese Application JP2014-14919, the content to which is hereby incorporated by reference into this application.

BACKGROUND OF THE INVENTION

1. Field of the Invention

The present invention relates to a horizontal cavity surface emitting laser device.

2. Description of the Related Art

Along with the development of information technologies, data transmission using optical fiber communication has been rapidly developed. Hitherto, the optical fiber communication technology has been mainly used in long-distance high-speed data transmission typified by a terrestrial backbone and submarine optical communication, an access communication network typified by fiber to the home (FTTH), and a metropolitan area network connecting the backbone and the access communication network. In recent years, along with the widespread use of the Internet and mobile phones, the transmission capacity has dramatically increased, and the optical fiber communication has spread even to a storage area network (SAN) and the Ethernet (trademark) (local area network: LAN) connecting in-bureau high-speed network devices. Further, the transmission rate has been shifted from conventional 10-Gbps base to 40/100-Gbps base, and an optical communication standard of a 100-gigabit Ethernet for 100-gigabit transmission was standardized on June, 2010.

Further, in recent years, the throughput of a high-end router used in a backbone system has reached 1 Tbps, and further expansion of the capacity is expected in the future. Therefore, optical interconnections hold great promise in order to effectively process large-capacity data in data transmission between those transmission devices (few meters to hundreds of meters) or in data transmission within an extremely short distance such as inside a device (few centimeters to tens of centimeters). A semiconductor laser device, which is a transmission light source of an optical module that transmits and receives an optical signal, is classified into three types depending on the combination of its cavity direction (vertical resonance or horizontal resonance) and a surface from which the laser light is emitted (edge emission or surface emission). The first type is a horizontal cavity edge emitting laser device, the second type is a vertical cavity surface emitting laser device, and the third type is a horizontal cavity surface emitting laser device.

In Japanese Patent Application Laid-open No. 2010-45066 (hereinafter referred to as Patent Literature 1), there is disclosed a semiconductor laser that utilizes distributed Bragg reflection to shorten an active region and suppress a temperature rise in the device. In Internal Patent WO2005/072224 (hereinafter referred to as Patent Literature 2), there is disclosed a single chip for bidirectional photonic operation, in which a laser and a detector are integrated on an epitaxial layer and which is configured to make an access to a single fiber. In Japanese Patent Application Laid-open No. 2007-5594 (hereinafter referred to as Patent Literature 3), there is disclosed an optical communication module of a surface emitting type, which is excellent in heat radiation performance and has lower power consumption. In IEEE PHOTONICS TECHNOLOGY LETTERS, VOL. 3, NO. 9, 1991, pp. 776-778 (hereinafter referred to as Non-Patent Literature 1), there are described room-temperature continuous oscillation characteristics of a horizontal cavity surface emitting laser including an optical waveguide including an InGaAsP active layer formed over an InP substrate, a reflecting mirror inclined at an angle of 45° and formed at an end portion of the optical waveguide, and a circular lens formed at a position on the rear surface of the InP substrate so as to be opposed to the 45° reflecting mirror.

SUMMARY OF THE INVENTION

Reduction in cost of the above-mentioned optical module for transmitting and receiving an optical signal is strongly demanded in order to provide the infrastructure of the optical fiber communication at lower cost. Therefore, it can be said that mass production at lower cost of the semiconductor laser device, which is the optical signal transmission light source, is also one of the major challenges. In order to reduce the cost in mass production, it is important to increase the production yield and facilitate the inspection process. In particular, if it is possible to realize a laser structure capable of facilitating the inspection process regardless of the laser performance, the laser structure can greatly contribute to cost reduction, and is thus useful.

The above-mentioned first horizontal cavity edge emitting laser device includes an optical waveguide formed in a horizontal direction in a substrate plane, and is configured to emit laser light from an end surface obtained by dividing the substrate through cleavage. This laser structure can attain a large cavity length of up to hundreds of micrometers, and hence a high output of tens of milliwatts can be obtained even under a high temperature. However, it is necessary to install an optical component for receiving the laser light adjacently to the laser device in a mounting substrate plane. Therefore, this type is not adequate to multi-channel high-density packaging or downsizing of the entire module. Further, the horizontal cavity edge emitting laser is classified into two types of a Fabry-Perot (FP) type and a distributed feedback (DFB) type depending on the cavity structure. In the former type, mirrors are arranged at both ends of the active layer to feedback the light. Those mirrors require flatness at the atomic level, and hence cleaved end surfaces are used. Further, from the viewpoint of reduction in oscillation threshold current or the like, a structure in which a highly reflective dielectric film is deposited on the cleaved end surface is normally used. On the other hand, the DFB laser has a resonance structure formed by integrating a diffraction grating in a layer different from the active layer at a position overlapping with the active layer in plan view above or below the active layer. However, also in the DFB laser, from the viewpoint in terms of practical use such as a longitudinal single-mode oscillation yield, optical output, and light distribution control in the optical-axis direction, the end surface requires a structure in which a dielectric reflective film is deposited on the cleaved end surface. Therefore, the horizontal cavity edge emitting laser requires, after the wafer process, a step of dividing a wafer by a cleavage step and forming a dielectric film thereon.

In Patent Literature 1, there is disclosed an example in which a distributed Bragg reflector (DBR) mirror is integrated in a wafer plane, and a cavity is constructed only through the wafer process. However, in this structure, from the viewpoint of a longitudinal single-mode oscillation yield, it is necessary to remove the residual reflection component from the end surface. Therefore, both ends of the DBR mirror are formed as cleaved ends, and both the ends are coated with dielectric antireflective films.

Next, the second vertical cavity surface emitting laser device is a laser having a structure in which the cavity is formed in a direction perpendicular to the semiconductor substrate, and laser light is emitted perpendicularly with respect to the wafer plane. Therefore, an arrangement of installing a light receiving member on the upper surface of the device is possible, which is advantageous to increase the density in the mounting substrate plane. In addition, the manufacture of the vertical cavity surface emitting laser device is completed only through the wafer process, and hence the laser characteristics can be evaluated in a wafer state. Therefore, the defect inspection of the laser device is possible at a wafer level. Therefore, as compared to a laser device whose manufacturing process does not end only through the wafer process as the first horizontal cavity edge emitting laser, this structure has a great advantage in terms of inspection cost. However, in the case of this structure, the cavity length is extremely small because the length is determined based on the crystal growth film thickness, and it is essentially difficult to obtain a high optical output.

The third horizontal cavity surface emitting laser device can be said to have a laser structure combining the advantages of the above-mentioned two lasers. In this structure, a cavity is formed in a horizontal direction in a substrate plane, and a reflecting mirror is integrally formed thereto. The reflecting mirror is inclined by 45° in order to cause the laser light to be emitted from the front surface or the rear surface of the substrate.

In such a horizontal cavity surface emitting laser configured to emit light from the substrate surface, the lens can be monolithically integrated on the light emitting surface with relative ease. By monolithically integrating the lens to the device, the number of components such as an external lens and a member for supporting the external lens can be reduced. It is also possible to reduce the area for arranging those members. Therefore, an optical system for connecting an optical device and a light receiving portion can be reduced in component cost and size, and thus it can be said that the horizontal cavity surface emitting laser has a structure suitable for high-density packaging. Further, the horizontal cavity surface emitting laser can realize alignment between a lens and a laser with extremely higher accuracy as compared to the case where the external lens is used because the lens and the light emitting position can be controlled by the accuracy of a semiconductor process. Therefore, it can be said that the horizontal cavity surface emitting laser in which the lens is monolithically integrated to the rear surface of the substrate is a device suitable for the next-generation optical communication in view of both the transmission capacity and cost.

However, in the structure of the horizontal cavity surface emitting laser device disclosed in Non-Patent Literature 1 and Patent Literature 1, a DFB or DBR type cavity structure is employed, which requires a cleaved end surface and a dielectric reflective film as the laser rear end surface. Therefore, the laser device cannot be inspected at a wafer level. Further, in the horizontal cavity surface emitting laser disclosed in Patent Literature 3, similarly to the case of the edge emitting laser in which the DBR is integrated, which is disclosed in Patent Literature 1, the DBR end requires an antireflective film for removing the residual reflection component. Therefore, also in this case, the laser device cannot be inspected at a wafer level. On the other hand, the horizontal cavity surface emitting laser disclosed in Patent Literature 2 uses an etched end surface as the laser rear end surface, but the etched end surface cannot exhibit an atomic plane unlike the cleaved surface. Therefore, reflection and scatter may occur, and hence sufficient output characteristics may not be obtained.

One or more embodiments of the present invention has been made in view of the above-mentioned circumstances, and has an object to provide a horizontal cavity surface emitting laser device which is capable of suppressing the inspection cost and also has sufficient output characteristics.

In one or more embodiments of the present invention, a horizontal cavity surface emitting laser device includes an active layer formed over one surface of a semiconductor substrate. The active layer is configured to generate light to be emitted in one direction along the one surface of the semiconductor substrate and in another direction opposite to the one direction. The horizontal cavity surface emitting laser device also includes a rear distributed Bragg reflector unit formed at an end of the active layer in the one direction and configured to reflect the light emitted from the active layer. The rear distributed Bragg reflector unit includes a waveguide layer configured to guide light and a distributed Bragg reflector configured to reflect the light in the waveguide layer. The horizontal cavity surface emitting laser device further includes an optical component configured to guide, in a direction different from the one direction and the other direction, the light emitted from an end of the rear distributed Bragg reflector unit in the one direction. The horizontal cavity surface emitting laser device further includes a front reflecting mirror formed over the one surface side. The front reflecting mirror is configured to reflect the light emitted from the active layer in the other direction toward another surface side of the semiconductor substrate.

The horizontal cavity surface emitting laser device may further include a condenser lens formed over the other surface of the semiconductor substrate. The condenser lens may be configured to condense the light reflected by the front reflecting mirror. The horizontal cavity surface emitting laser device may further include an antireflective film formed on the condenser lens and configured to prevent reflection, the antireflective film being made of a dielectric material.

In the horizontal cavity surface emitting laser device, the optical component may guide the light emitted from the end of the rear distributed Bragg reflector unit in the one direction toward the other surface side of the semiconductor substrate, and the antireflective film may be formed on the other surface of the semiconductor substrate also at a position through which the light emitted from the optical component passes.

In the horizontal cavity surface emitting laser device, the optical component may include a rear reflecting mirror formed over the one surface side of the semiconductor substrate.

In the horizontal cavity surface emitting laser device, the optical component may include a bent waveguide configured to guide light in a direction different from the one direction and the other direction, and the bent waveguide may include, at an end portion thereof, a window structure made of a single semiconductor material having a band gap that prevents absorption of a wavelength of laser light.

In the horizontal cavity surface emitting laser device, the horizontal cavity surface emitting laser device may include a distributed feedback laser in which a diffraction grating is integrated in a layer different from the active layer at a position overlapping with the active layer in plan view.

The horizontal cavity surface emitting laser device may further include an emission-side distributed Bragg reflector unit provided to an end of the active layer in the other direction. The emission-side distributed Bragg reflector unit may include the waveguide layer and the distributed Bragg reflector.

The horizontal cavity surface emitting laser device may further include a modulator formed over the other direction side of the active layer.

In the horizontal cavity surface emitting laser device, the modulator may include an electro-absorption modulator.

In the horizontal cavity surface emitting laser device, the modulator may be a Mach-Zehnder modulator.

The horizontal cavity surface emitting laser device may further include a wavelength tunable unit configured to change a wavelength of emitted laser.

According to one or more embodiments of the present invention, the horizontal cavity surface emitting laser device can have sufficient output, and can suppress the inspection cost.

DETAILED DESCRIPTION OF THE INVENTION

Figure 1A:
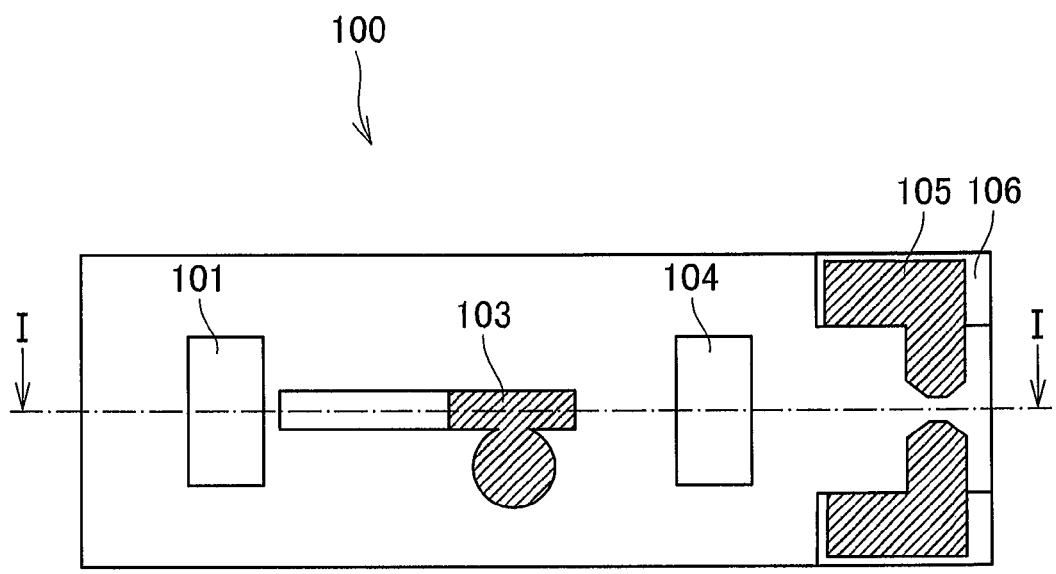
FIG. 1A is a plan view of a horizontal cavity surface emitting laser device according to a first embodiment of the present invention.

Referring to the accompanying drawings, embodiments of the present invention are described below. In the drawings, the same or similar elements are denoted by the same reference symbols, and repetitive description thereof is omitted.

[First Embodiment]

Figure 1B:
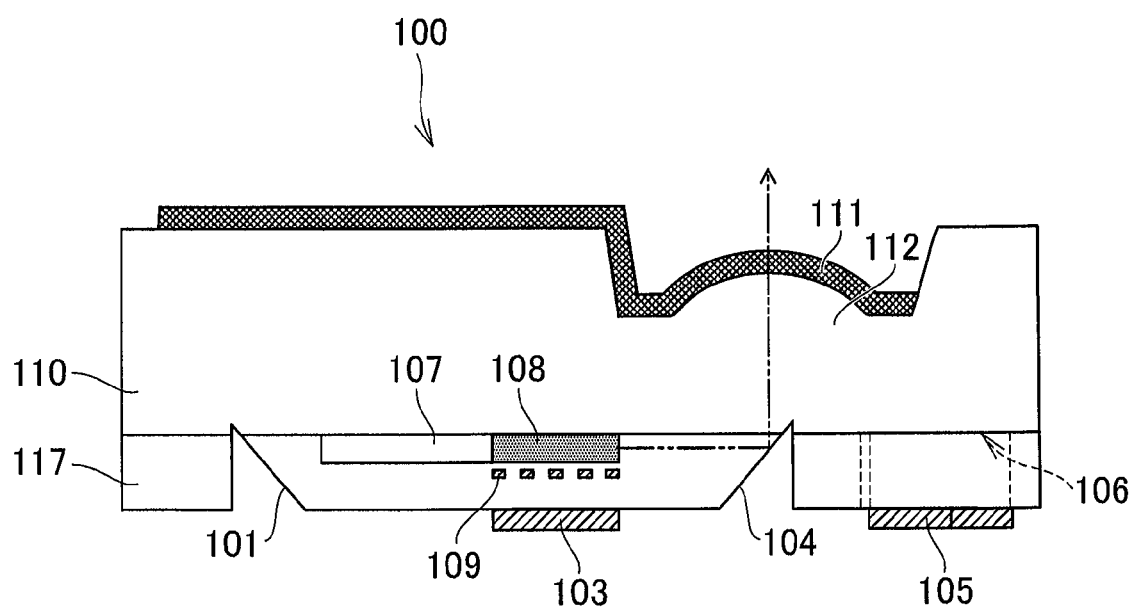
FIG. 1B is a sectional view in an optical-axis direction of the horizontal cavity surface emitting laser device according to the first embodiment.

With reference to FIGS. 1A and 1B, a structure of a horizontal cavity surface emitting laser device 100 according to a first embodiment of the present invention is described. FIG. 1A is a plan view of the horizontal cavity surface emitting laser device 100, and FIG. 1B is a sectional view taken along the line I-I of FIG. 1A, that is, a sectional view in an optical-axis direction of the horizontal cavity surface emitting laser device 100. The horizontal cavity surface emitting laser device 100 includes, in a laser part, an InGaAlAs active layer 108 formed over an n-type InP substrate 110, and has a ridge waveguide structure in which a p-type InP cladding layer 117 immediately below a cavity is etched into a protruded stripe shape. As illustrated in FIG. 1B, the horizontal cavity surface emitting laser device 100 is a DFB laser in which a diffraction grating 109 is formed immediately below the InGaAlAs active layer 108. The pitch of the diffraction grating 109 is designed to attain oscillation in a 1.3-μm band. The length of the DFB cavity is set to 150 μm in consideration of high-speed characteristics. In the following description, the "front" side indicates a direction in which the laser light is emitted from the InGaAlAs active layer 108 to be finally emitted from the horizontal cavity surface emitting laser device 100, and the "rear" side indicates the direction opposite thereto. In FIG. 1B, the state of the emitted laser light is indicated by the dashed-two dotted line arrow.

A contact layer 115 (described later) is formed over a lower portion of the ridge waveguide structure, and a p-type electrode 103 is formed over a lower portion of the contact layer 115. Further, the InGaAlAs active layer 108 is butt-joint connected to a rear distributed Bragg reflector unit (DBR mirror unit) 107 including a passive waveguide layer 127 (described later) and a DBR layer 125 (described later). The length of the DBR mirror unit 107 is set to 200 μm. With this structure, the high reflection function that has been attained by using the cleaved surface and the dielectric film in the related art is replaced by the DBR mirror unit 107.

Simultaneously, the residual reflected light from the DBR mirror unit 107 may be radiated toward the substrate with use of a rear monolithic integrated mirror (rear reflecting mirror) 101, and may thus be allowed to escape outside through an antireflective film 111 formed on the substrate surface, which is also formed on a surface of a monolithic integrated lens 112 (condenser lens) described later. Therefore, the entire manufacturing process completes in a wafer state, which enables characteristic inspection at a wafer level before the wafer is cut. Note that, in this embodiment, the diffraction grating 109 is formed, but the diffraction grating 109 may be omitted, and there may be employed a distributed Bragg reflector laser in which the DBR mirror unit including the passive waveguide and the DBR layer is butt-joint connected also to the front side of the InGaAlAs active layer 108.

On the front side of the light emitting end of the InGaAlAs active layer 108 and on the rear side of the DBR mirror unit 107, a front monolithic integrated mirror (front reflecting mirror) 104 and the rear monolithic integrated mirror 101 are formed, respectively, by etching a semiconductor embedded layer formed of the p-type InP cladding layer 117. The semiconductor embedded layer has a bandgap structure that prevents absorption of the laser light emitted from the InGaAlAs active layer 108. Further, the inside of the embedded layer is made of a single material, and hence the laser light propagates while spreading at a predetermined angle in accordance with the refractive index of the material. Such an embedded structure part is generally called a window structure. Further, a part of the p-type InP cladding layer 117 near the front monolithic integrated mirror 104 is etched until the n-type InP substrate 110 is exposed. Thus, an n-type electrode contact layer 106 is formed, and an n-type electrode 105 is formed over the device surface, to thereby achieve a flip-chip structure in which both of the p-type and n-type electrodes are arranged on the chip surface. Note that, in this embodiment, etching is carried out until the n-type InP substrate 110 is exposed, but the depth may be set so that the n-type InP substrate 110 is not exposed. The length from the right end in FIG. 1B to the InGaAlAs active layer 108 is 200 µm, and the length from the left end in FIG. 1B to the DBR mirror unit 107 is 150 µm. The length of the chip in the cavity direction is set to 700 µm. Further, the length of the chip in the cavity perpendicular direction is 250 µm. In the upper surface of the n-type InP substrate 110, a recessed step is formed, and further at the bottom portion of the step, the monolithic integrated lens 112 is formed by etching the n-type InP substrate 110. On the surface of the monolithic integrated lens 112, the antireflective film 111 formed of, for example, an alumina thin film is coated. In this embodiment, alumina is used, but any material that suppresses reflection can be used instead of alumina.

Next, with reference to FIGS. 2A to 2K, a method of manufacturing the DFB horizontal cavity surface emitting laser device 100 according to the embodiment of FIG. 1 is described in detail. FIGS. 2A to 2K are sectional views sequentially illustrating steps of manufacturing the horizontal cavity surface emitting laser device 100. Note that, those sectional views each illustrate a cross-section obtained by rotating the view in FIG. 1B by 180° in the figure in order to describe the lamination in order.

Figure 2A:
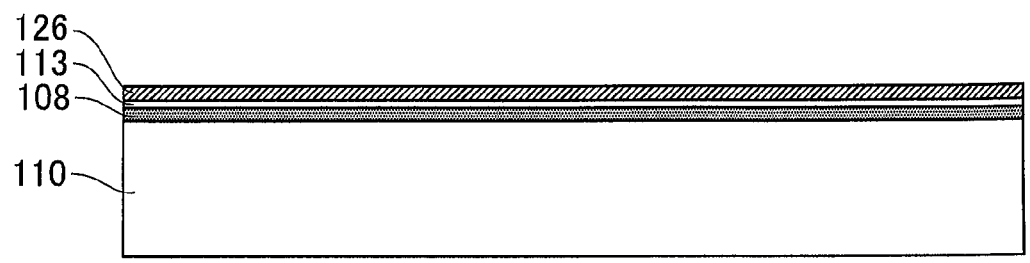
FIG. 2A is a sectional view illustrating a step of manufacturing the horizontal cavity surface emitting laser device of the first embodiment.

First, as illustrated in FIG. 2A, in order to form the structure of the laser part, a semiconductor multi-layer body is formed over the n-type InP substrate 110. The semiconductor multi-layer body includes the InGaAlAs active layer 108 made of InGaAlAs, which includes a light confinement layer made of n-type InGaAlAs, a strained multiple quantum well layer made of InGaAlAs, and a light confinement layer made of p-type InGaAlAs, an InP spacer layer 113, and a diffraction grating layer 126 made of a InGaAsP-based material. The InGaAlAs active layer 108 includes, between the n-type light confinement layer made of n-type InGaAlAs and the p-type light confinement layer made of p-type InGaAlAs, a multiple quantum well structure that is made of undoped InGaAlAs and includes a well layer WL having a thickness of 7 nm and a barrier layer BL having a thickness of 8 nm that are laminated by 5 cycles. Such a multiple quantum well structure is designed so that the laser to be output can realize sufficient characteristics.

Figure 2B:
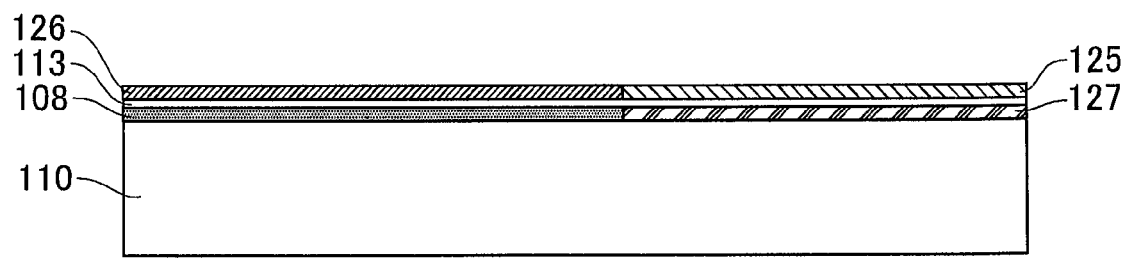
FIG. 2B is a sectional view illustrating a step of manufacturing the horizontal cavity surface emitting laser device of the first embodiment.

Next, the InGaAlAs active layer 108, the InP spacer layer 113, and the diffraction grating layer 126 were partially etched with use of a $SiO_2$ patterning mask and a sulfuric acid-based etchant. Subsequently, with use of metal organic chemical vapor deposition, in the etched part, the passive waveguide layer 127 including InGaAsP multiple quantum wells, and the DBR layer 125 made of an InGaAsP-based material for forming the DBR mirror unit 107 together with the passive waveguide layer 127 were grown (FIG. 2B).

Figure 2C:
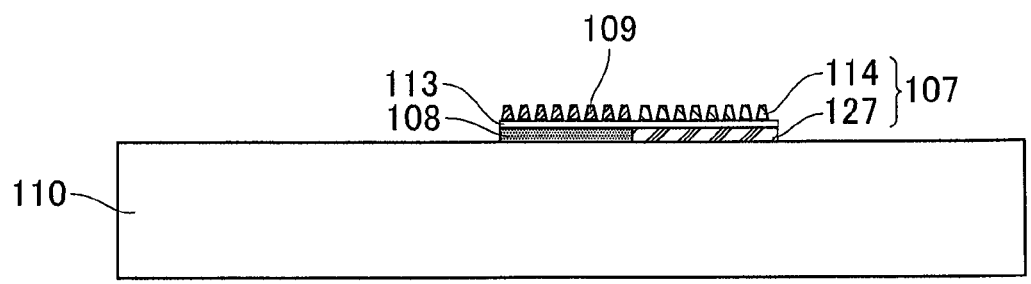
FIG. 2C is a sectional view illustrating a step of manufacturing the horizontal cavity surface emitting laser device of the first embodiment.

After that, with use of an electron beam exposure method, diffraction gratings 109 and 114 were formed immediately above the InGaAlAs active layer 108 and the passive waveguide layer 127, respectively, and the leading end portions of the InGaAlAs active layer 108 and the passive waveguide layer 127 were etched by a sulfuric acid-based etchant (FIG. 2C). At this time, the length in the cavity direction of the InGaAlAs active layer 108 and the length in the cavity direction of the DBR mirror unit 107 were set to 150 µm and 200 µm, respectively. The structure of the diffraction grating 109 immediately above the InGaAlAs active layer 108 was formed so that the oscillation wavelength of the DFB laser at room temperature was 1,310 nm. Note that, this embodiment describes a case where the diffraction grating 109 is formed uniformly in the entire region of the DFB laser, but as necessary, a so-called phase shift structure may be provided in which the phase of the diffraction grating 109 is shifted in a partial region that overlaps with the InGaAlAs active layer 108. Alternatively, the period of the diffraction grating 109 may change in the axial direction. Further, the structure of the diffraction grating 114 immediately above the passive waveguide layer 127 was designed to have a reflectance spectrum with a stop band in which the reflectance was 98% or more in a range of approximately 60 nm with respect to 1,310 nm. Further, the layer structure was optimized so that the InGaAlAs active layer 108 and the passive waveguide layer 127 had the same effective propagation constant.

Figure 2D:
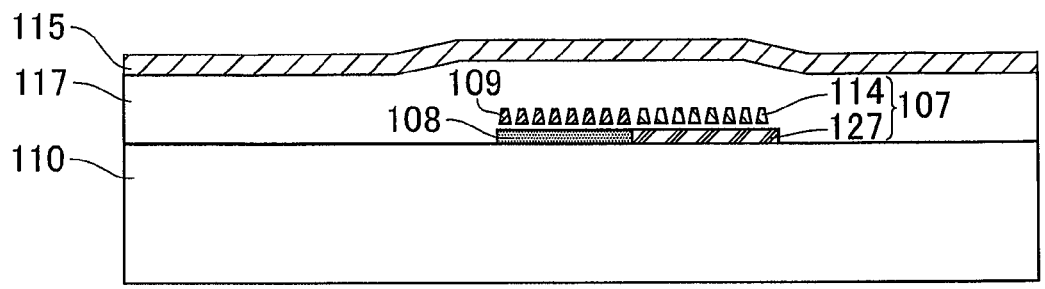
FIG. 2D is a sectional view illustrating a step of manufacturing the horizontal cavity surface emitting laser device of the first embodiment.
Figure 2E:
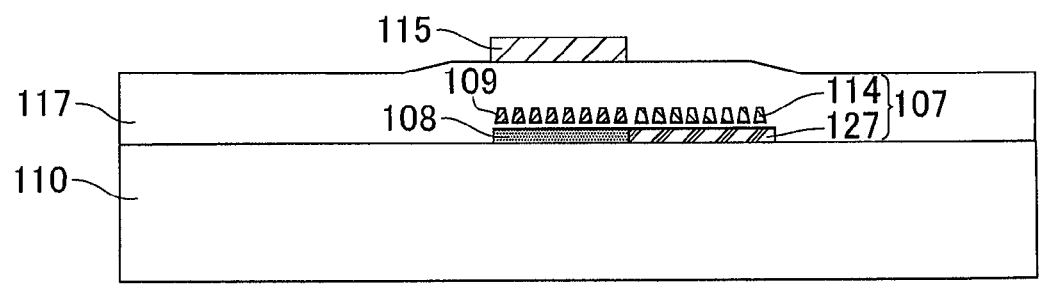
FIG. 2E is a sectional view illustrating a step of manufacturing the horizontal cavity surface emitting laser device of the first embodiment.
Figure 2F:
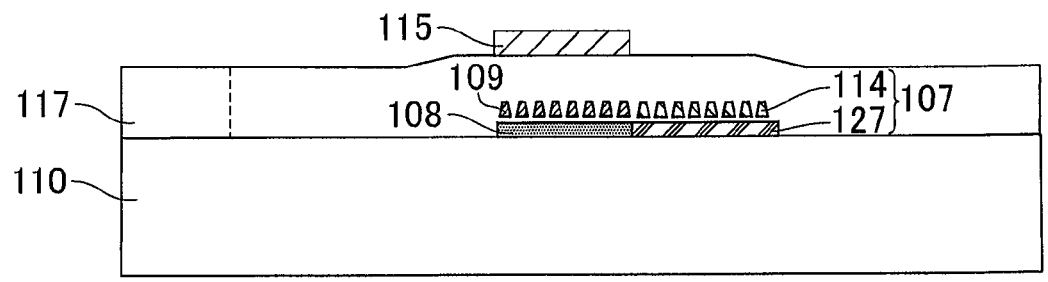
FIG. 2F is a sectional view illustrating a step of manufacturing the horizontal cavity surface emitting laser device of the first embodiment.

Next, the p-type InP cladding layer 117 made of p-type InP is formed, and then the contact layer 115 made of p-type InGaAs is formed (FIG. 2D). The carrier concentration due to doping was set to $10^{18}$ $cm^{-3}$. The InP wafer having this multi-layer structure was etched with use of a resist patterning mask and a phosphoric acid-based etchant to remove the contact layer 115 in a part outside a region immediately above the InGaAlAs active layer 108 (FIG. 2E). Subsequently, a silicon dioxide film is covered onto the InP wafer to form a protective mask. With use of this silicon dioxide mask, the ridge waveguide structure was formed immediately above the InGaAlAs active layer 108 (FIG. 2F). Further, although not shown, simultaneously with the formation of the ridge waveguide structure, the p-type InP cladding layer 117 was removed in a region in which the n-type electrode contact layer 106 was to be formed.

Figure 2G:
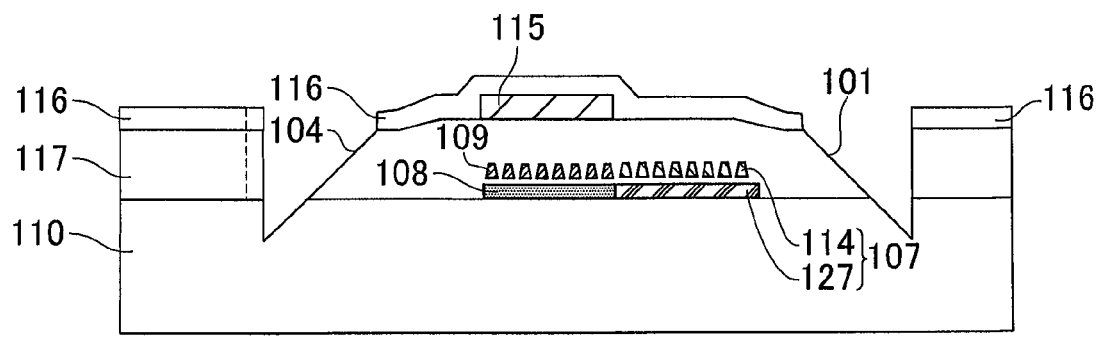
FIG. 2G is a sectional view illustrating a step of manufacturing the horizontal cavity surface emitting laser device of the first embodiment.
Figure 2H:
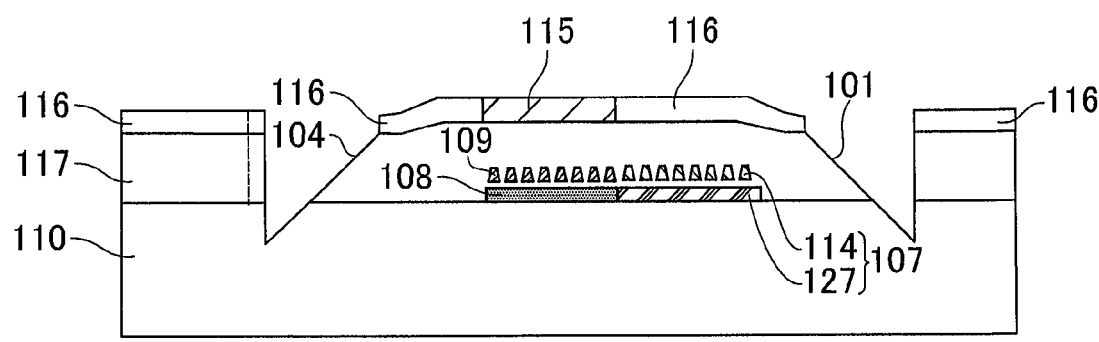
FIG. 2H is a sectional view illustrating a step of manufacturing the horizontal cavity surface emitting laser device of the first embodiment.

After that, as illustrated in FIG. 2G, a silicon nitride film (SiN protective film 116) as an etching mask was formed, and a part on the front side of the InGaAlAs active layer 108 and a part on the rear side of the passive waveguide layer 127 were respectively etched at an inclination angle of 45°, to thereby form the front monolithic integrated mirror 104 and the rear monolithic integrated mirror 101 each formed of the p-type InP cladding layer 117 and the n-type InP substrate. This 45° inclination etching was realized by etching the wafer while inclining the wafer at an angle of 45° with use of chemically assisted ion beam etching (CAIBE) using chlorine and argon gas. Note that, the etching method using CAIBE is described in this embodiment, but reactive ion beam etching (RIBE) using chlorine gas or wet etching may be used. The cross-section in the optical-axis direction of the front monolithic integrated mirror 104 as the reflecting mirror is formed into a single bevel shape in which one cut surface is perpendicular to the surface of the n-type InP substrate 110, but the cross-section may be formed into a V-shape in which both of the cut surfaces are inclined with respect to the surface of the n-type InP substrate 110. Alternatively, a structure only with an inclined surface may be employed. In this embodiment, the monolithic integrated mirror is formed at an angle of 45°, but any other angles may be employed. Particularly in the case of the rear monolithic integrated mirror 101, the monolithic integrated mirror can be formed to allow reflection in a direction that does not affect the laser emission on the front side. Meanwhile, by forming the rear monolithic integrated mirror 101 and the front monolithic integrated mirror 104 into the same shape, the monolithic integrated mirrors may be simultaneously formed to simplify the manufacturing process and suppress the manufacturing cost.

Figure 2I:
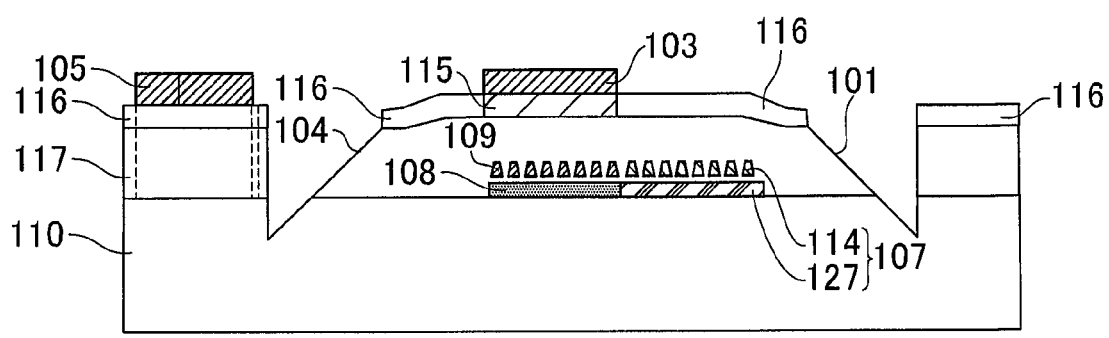
FIG. 2I is a sectional view illustrating a step of manufacturing the horizontal cavity surface emitting laser device of the first embodiment.
Figure 2J:
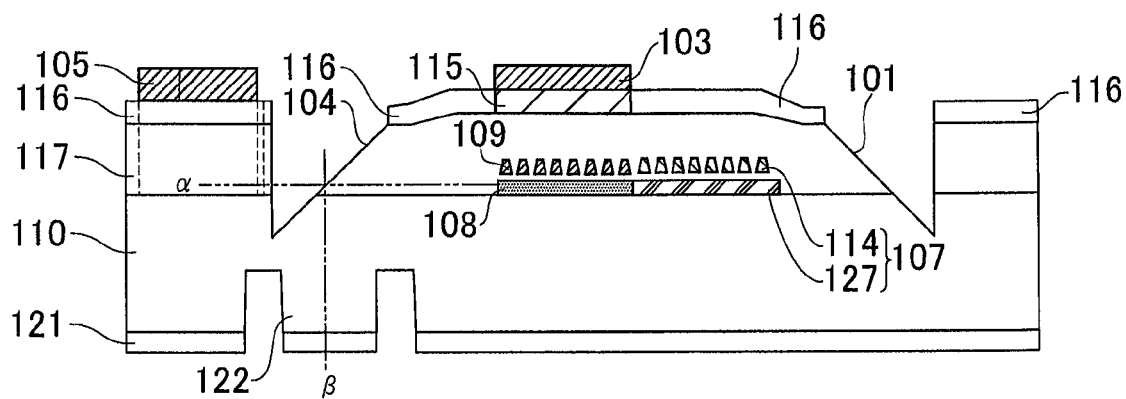
FIG. 2J is a sectional view illustrating a step of manufacturing the horizontal cavity surface emitting laser device of the first embodiment.
Figure 2K:
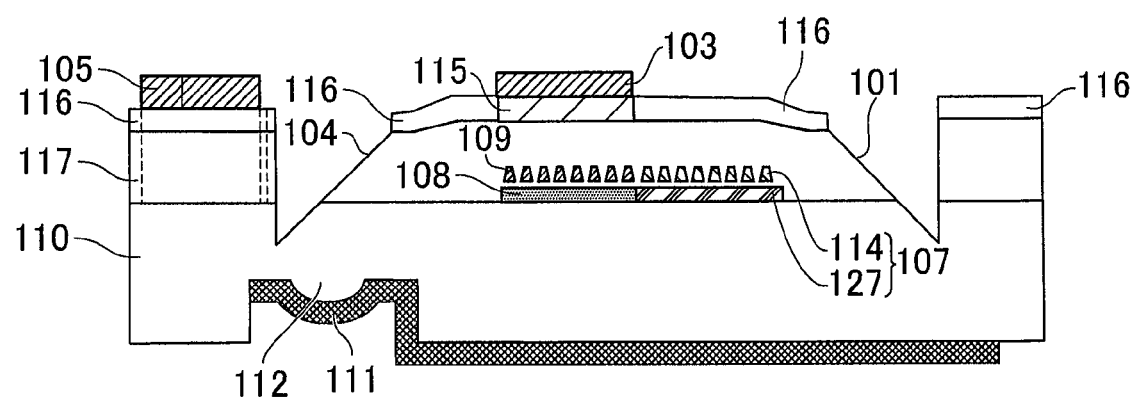
FIG. 2K is a sectional view illustrating a step of manufacturing the horizontal cavity surface emitting laser device of the first embodiment.

Next, the SiN protective film 116 in a part above the p-type InGaAs contact layer 115 was removed (FIG. 2H), the p-type electrode 103 was vapor-deposited, and then the n-type electrode 105 was vapor-deposited (FIG. 2I). After that, as illustrated in FIG. 2J, the rear surface of the substrate was ground to a thickness of 150 µm, and then a silicon nitride mask 121 was formed over the rear surface of the substrate. Subsequently, the rear surface of the substrate was etched with use of reactive ion etching using mixed gas of methane and hydrogen, to thereby form a circular shape with a diameter of 125 µm and a depth of 30 µm. At this time, the silicon nitride mask 121 is formed so that a center axis (β) of the circle of the cylinder intersects with an extended line (α) of the passive waveguide layer 127 on the 45°-inclined mirror. Note that, the circular shape may be an oval shape in some cases depending on the intended use. Subsequently, the silicon nitride mask formed in a part above a column-like part 122 surrounded by a doughnut-like dug part was removed to perform wet etching. With this, the surface of the column-like part was etched and the corners thereof were removed. Thus, the monolithic integrated lens 112 serving as a rear surface InP lens was formed (FIG. 2K). Note that, the surface of the monolithic integrated lens 112 is covered with the antireflective film 111 in the subsequent step. At this time, the antireflective film 111 is formed not only on the lens surface, but is extended to a radiation surface of the residual transmitted light that is radiated in the substrate direction due to the rear monolithic integrated mirror.

The entire manufacturing process of the laser of this embodiment completes with the above-mentioned steps. Subsequently, in the wafer state, the p-type electrode 103 and the n-type electrode 105 were caused to contact with a probe for energization, to thereby check the initial characteristics of each laser. After that, the laser device satisfying the desired characteristics was cut out through dicing to form a chip.

The laser oscillation characteristics of the horizontal cavity surface emitting laser device 100 manufactured by the above-mentioned steps were evaluated. As a result, a satisfactory single wavelength oscillation was obtained in which the oscillation threshold current was 7 mA, the slope efficiency was 0.3 W/A, and a sub-mode suppression ratio was 40 dB or more at room temperature.

Further, characteristic deterioration of the current-light output characteristics and the oscillation spectrum depending on the residual reflection from the DBR mirror unit 107 was not observed, and characteristics similar to those in the case where a highly reflective dielectric film was formed on the cleaved end surface were obtained. As a result, it was confirmed that the highly reflective structure and the antireflective structure of the present invention were effectively functioned.

In this embodiment, the diameter of the lens was set to 120 µm, and the curvature of the lens was set to 0.004 µm$^{-1}$. Further, the distance from the lens surface to the light emitting point was set to 160 µm. Through this design, the laser light is condensed at a position separated by about 100 µm from the lens surface. At this time, the far field pattern (FFP) of the laser light had the full width at half maximum of about 13° in both of the cavity perpendicular direction and the horizontal direction, and the light spot size at the light condensed position was about 40 µm in diameter.

A light coupling experiment was executed with use of this laser array and a graded-index (GI) multi-mode fiber (MMF) with a core diameter of 50 µm. As a result, by arranging the MMF at the light condensed position, a low-loss light coupling with a coupling loss of 0.3 dB or less was obtained. Further, satisfactory high-speed characteristics reflecting the short-cavity structure were exhibited, and an operation of 25 Gbps was realized at 85° C. under the driving conditions of a bias current of 60 mA and a peak-to-peak current amplitude of 40 mA. As described above, by applying the present invention, a low-cost high-speed operation laser for next generation optical communication was able to be manufactured.

Note that, this embodiment shows an example in which the present invention is applied to the InGaAlAs quantum well laser with a wavelength band of 1.3 µm, which is formed over the InP substrate. However, the substrate material, the active layer material, and the oscillation wavelength are not limited to those in this embodiment. The present invention is similarly applicable to other material systems such as a 1.55-µm band InGaAsP laser.

Further, in the above, the embodiment of the ridge structure is described, but the present invention is also applicable to a buried heterostructure (BH structure). Further, in this device, an electrically isolating groove is formed between adjacent devices in the manufacturing process. Therefore, when the chip is formed through cutting in an array shape, an array device can be formed.

[Second Embodiment]

Figure 3A:
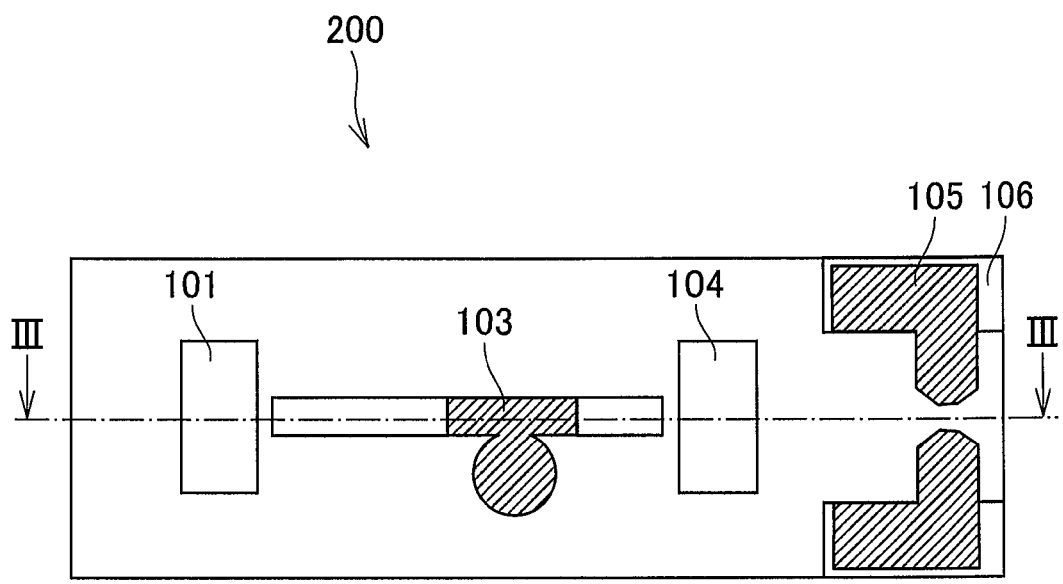
FIG. 3A is a plan view of a horizontal cavity surface emitting laser device according to a second embodiment of the present invention.
Figure 3B:
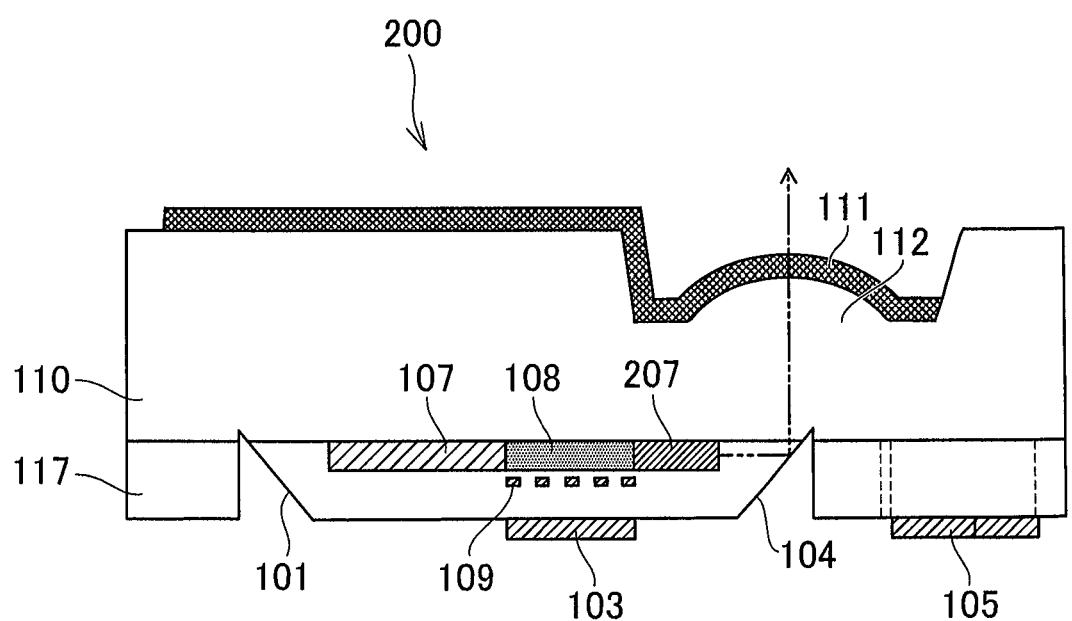
FIG. 3B is a sectional view in an optical-axis direction of the horizontal cavity surface emitting laser device according to the second embodiment of the present invention.

With reference to FIGS. 3A and 3B, a structure of a short-cavity horizontal cavity surface emitting laser device 200 with a wavelength band of 1.3 µm according to a second embodiment of the present invention is described. FIG. 3A is a plan view of the horizontal cavity surface emitting laser device 200, and FIG. 3B is a sectional view in the optical-axis direction, which is taken along the line III-III of FIG. 3A. The basic structure of the horizontal cavity surface emitting laser device 200 is a DFB laser having a ridge waveguide structure. The horizontal cavity surface emitting laser device 200 of this embodiment has a feature in that DBR mirror units 107 and 207 are butt-joint integrated to both ends of the active layer serving as the DFB cavity, and the rear monolithic integrated mirror 101 and the front monolithic integrated mirror 104 are arranged on the rear side of the DBR mirror unit 107 and the front side of the DBR mirror unit 207, respectively.

Now, the structure is described in detail with reference to FIGS. 3A and 3B. In the laser part, the InGaAlAs active layer 108 and the p-type InP cladding layer 117 are laminated on the n-type InP substrate 110, and the diffraction grating 109 is integrated immediately below the InGaAsAl active layer 108. The pitch of the diffraction grating 109 was designed to attain an oscillation wavelength of 1,300 nm at room temperature. Note that, in this embodiment, the λ/4-shifted diffraction grating 109 is used, but a uniform diffraction grating or a diffraction grating 109 that changes in the optical-axis direction may be employed. Further, on the front side of the InGaAsAl active layer 108, the DBR mirror unit 207 including the passive waveguide layer 127 and the DBR layer 125 is butt-joint integrated, and on the rear side thereof, the DBR mirror unit 107 is butt-joint integrated. Note that, the part of the InGaAlAs active layer 108 and the DBR mirror units 107 and 207 on the front and rear sides thereof each have an adjusted effective refractive index so as to have the same effective propagation constant.

Although not shown, the laminated structure is processed into a ridge waveguide structure. The ridge forming step is similar to that in the first embodiment. Further, similarly to the first embodiment, simultaneously with the ridge formation, the p-type InP cladding layer 117 was removed in a region in which the n-type electrode was to be formed, and the n-type electrode contact layer 106 was formed simultaneously with the removal of the contact layer 115 in the mirror forming portion. Thus, a flip-chip structure was achieved in which the p-type electrode 103 and the n-type electrode 105 were formed over the front surface of the device.

Further, in the light emitting portion of the rear surface of the substrate, the n-type InP substrate 110 is etched to form the monolithic integrated lens 112, and the antireflective film 111 made of, for example, $AlO_x$ is laminated from the surface of the monolithic integrated lens 112 to a region immediately above the rear monolithic integrated mirror 101 on the front surface of the substrate. In this embodiment, the cavity length of the DFB is set to 70 μm, and the coefficient of coupling of the diffraction grating is set to 100 $cm^{-1}$, but other values may be used. Further, the length of the DBR mirror unit 207 on the front side of the InGaAlAs active layer 108 was set to 30 μm, the length of the DBR mirror unit 107 on the rear surface thereof was set to 100 μm, and reflectances of the DBR mirror units 207 and 107 with respect to a wavelength of 1,300 nm were set to 70% and 98%, respectively. Further, the entire length of the chip was set to 700 μm. However, the dimensions and the coefficients are not limited to the above-mentioned values, and may be appropriately changed in accordance with the demand and performance.

Similarly to the first embodiment, the entire process of manufacturing the laser of this embodiment was completed through a wafer process, and the initial selection inspection was able to be executed at a wafer level. Subsequently, a device exhibiting satisfactory initial characteristics was formed into a chip through dicing, and was flip-chip mounted in a junction down state on an AlN sub-mount including a coplanar high-frequency transmission line. When the DC current characteristics of the horizontal cavity surface emitting laser device 200 were evaluated in this form, satisfactory oscillation characteristics were obtained in which the threshold current was 5 mA and the slope efficiency was 0.35 W/A at room temperature. Further, a satisfactory single wavelength oscillation was obtained at a wavelength of 1,300 nm. Further, oscillation was obtained at the Bragg wavelength reflecting the λ/4-shifted structure. In those characteristics, characteristic deterioration depending on the residual reflection from the rear or front DBR was not observed. Next, when the high frequency characteristics of this laser were measured, a wide modulation bandwidth at room temperature reflecting the short-cavity structure was obtained in which the modulation bandwidth at room temperature in a low bias current of 40 mA was 30 GHz. As described above, by applying the present invention, a high-speed device suitable as a next generation high-speed light source was able to be manufactured at low cost.

[Third Embodiment]

Figure 4A:
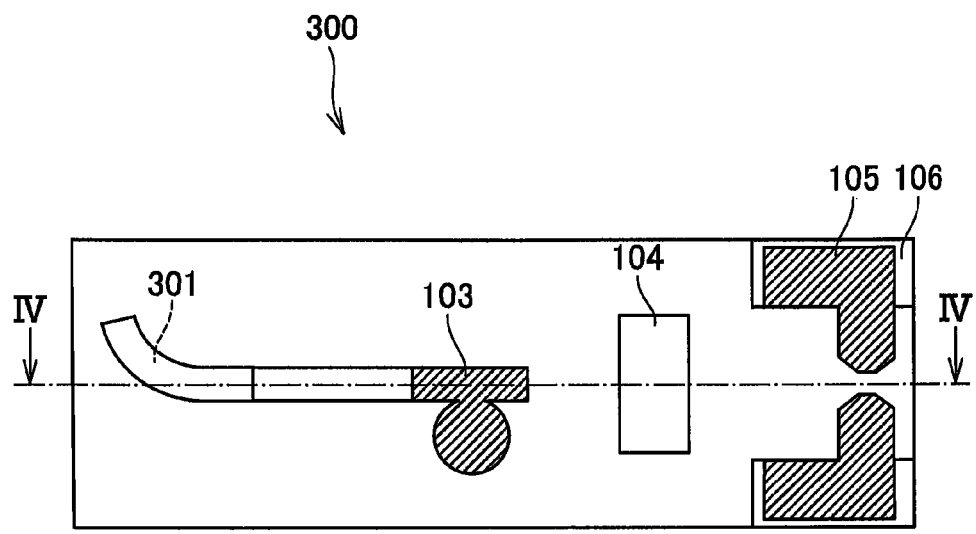
FIG. 4A is a plan view of a horizontal cavity surface emitting laser device according to a third embodiment of the present invention.
Figure 4B:
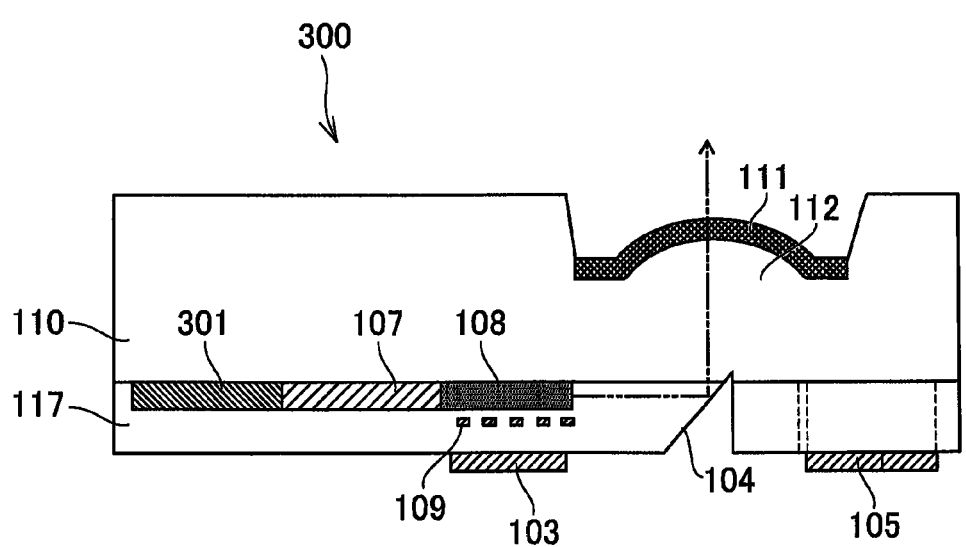
FIG. 4B is a sectional view in an optical-axis direction of the horizontal cavity surface emitting laser device according to the third embodiment of the present invention.

With reference to FIGS. 4A and 4B, a structure of a short-cavity horizontal cavity surface emitting laser device 300 with a wavelength band of 1.3 μm according to a third embodiment of the present invention is described. FIG. 4A is a plan view of the horizontal cavity surface emitting laser device 300, and FIG. 4B is a sectional view in the optical-axis direction, which is taken along the line IV-IV of FIG. 4A. The basic structure of the horizontal cavity surface emitting laser device 300 is similar to that in the first embodiment. The third embodiment differs from the first embodiment in that a bent waveguide is arranged on the rear side of the DBR mirror unit 107. The structure and its effect are described in detail below with reference to FIGS. 4A and 4B. As illustrated in FIGS. 4A and 4B, in the laser part, the InGaAsAl active layer 108 and the p-type InP cladding layer 117 are laminated on the n-type InP substrate 110, and the diffraction grating 109 is integrated immediately below the InGaAsAl active layer 108. The pitch of the diffraction grating 109 was designed to attain an oscillation wavelength of 1,300 nm at room temperature. Note that, in this embodiment, the λ/4-shifted diffraction grating 109 is used, but a uniform diffraction grating or a diffraction grating 109 that changes in the optical-axis direction may be employed. Further, on the rear side of the InGaAlAs active layer 108, the DBR mirror unit 107 including the passive waveguide layer 127 and the DBR layer 125 is butt-joint integrated. Note that, the part of the InGaAlAs active layer 108 and the DBR mirror unit 107 on the rear side thereof are all designed to be the same as those in the first embodiment. Further, the DBR mirror unit 107 has a bent waveguide 301 that is butt-joint integrated thereto. At this time, the effective propagation constant of the bent waveguide 301 was designed to be a value close to those of the InGaAlAs active layer 108 and the DBR mirror unit 107. Further, at a terminal end of the bent waveguide, a window structure is formed of the p-type InP cladding layer 117.

Although not shown, the laminated structure is processed into a ridge waveguide structure. The ridge forming step is completely the same as that in the first embodiment. Further, similarly to the first embodiment, simultaneously with the ridge formation, the p-type InP cladding layer 117 was removed in a region in which the n-type electrode was to be formed, and the n-type electrode contact layer 106 was formed simultaneously with the removal of the contact layer 115 in the mirror forming portion. Thus, a flip-chip structure was achieved in which the p-type electrode 103 and the n-type electrode 105 were formed over the front surface of the device. Further, in the light emitting portion of the rear surface of the substrate, the n-type InP substrate 110 was etched to form the monolithic integrated lens 112, and the antireflective film 111 was laminated on the surface of the monolithic integrated lens 112.

In this horizontal cavity surface emitting laser device 300, part of laser light that is transmitted to the end of the DBR mirror unit 107 is allowed to escape outside of the chip by the bent waveguide, to thereby remove the residual reflection component. Therefore, also in this horizontal cavity surface emitting laser device 300, the laser manufacturing process was able to be completed through a wafer process. When the wafer process and the initial characteristics in the wafer state were evaluated, and the satisfactory device was evaluated similarly to the first embodiment, the same laser characteristic as that of the first embodiment was obtained. Thus, it was shown that the third embodiment of the present invention was suitable as a high-speed low-cost light source supporting the wafer-level inspection.

[Fourth Embodiment]

Figure 5A:
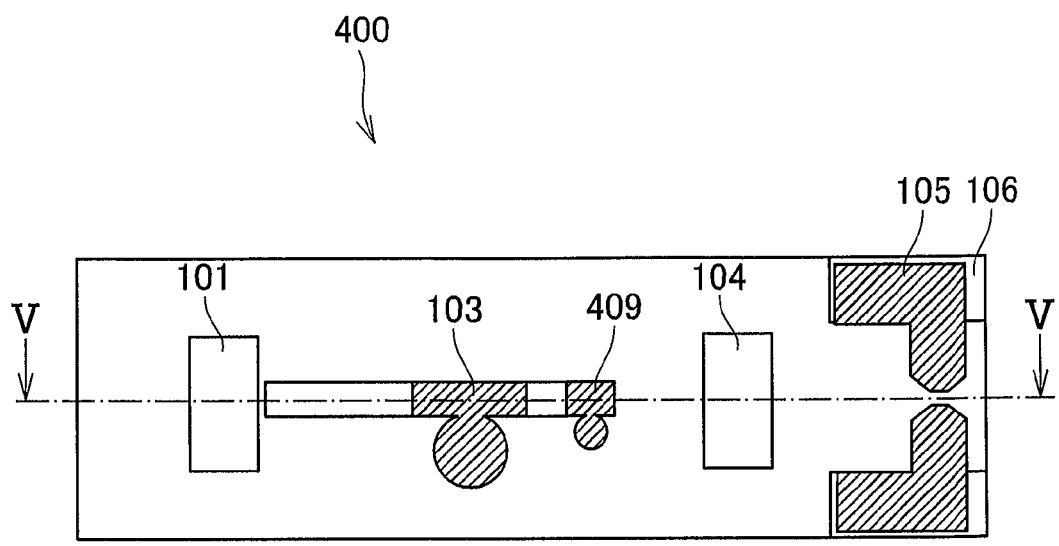
FIG. 5A is a plan view of a horizontal cavity surface emitting laser device according to a fourth embodiment of the present invention.
Figure 5B:
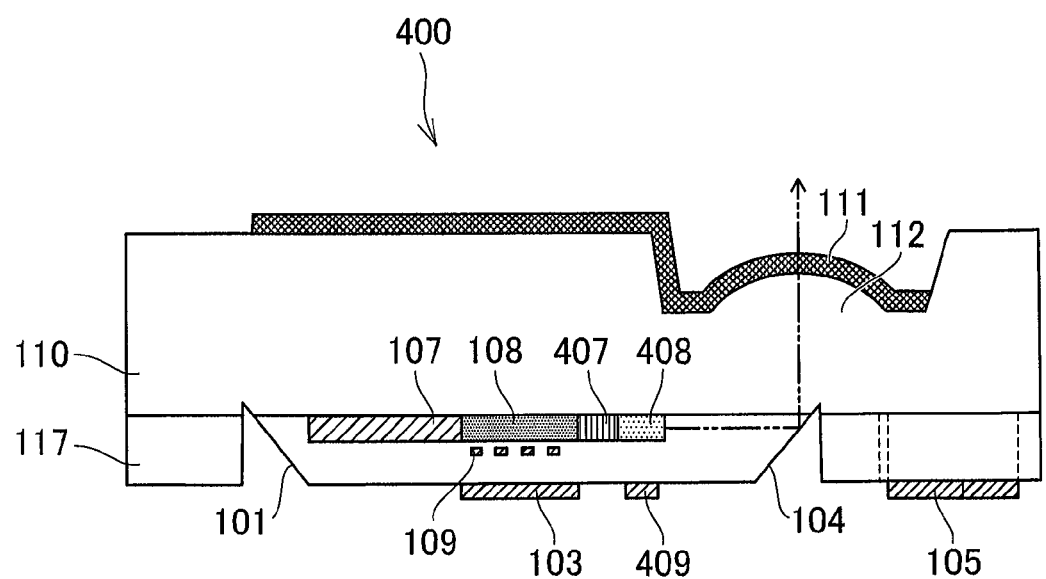
FIG. 5B is a sectional view in an optical-axis direction of the horizontal cavity surface emitting laser device according to the fourth embodiment of the present invention.

With reference to FIGS. 5A and 5B, a structure of a modulator-integrated horizontal cavity surface emitting laser device 400 according to a fourth embodiment of the present invention is described. FIG. 5A is a plan view of the horizontal cavity surface emitting laser device 400, and FIG. 5B is a sectional view in the optical-axis direction, which is taken along the line V-V of FIG. 5A. The process of manufacturing the horizontal cavity surface emitting laser device 400 is described below.

First, the InGaAsAl active layer 108 is grown on the n-type InP substrate 110 with use of metal organic chemical vapor deposition. Subsequently, the InGaAsAl active layer 108 in a region outside the laser part was selectively etched, and then an InGaAsAl-based modulator layer 408 was grown with use of metal organic chemical vapor deposition. Further, the modulator layer 408 in a region outside the modulator part was selectively etched, and finally, the DBR mirror unit 107 including the passive waveguide layer 127 and the DBR layer 125 was grown with use of metal organic chemical vapor deposition. A passive waveguide layer 407 is disposed between the InGaAsAl active layer 408 and the modulator layer 408. After that, by using the steps similar to those of the first embodiment, the ridge DFB structure, the ridge electro-absorption modulator 408, the rear monolithic integrated mirror 101, the front monolithic integrated mirror 104, and the monolithic integrated lens 112 were manufactured.

The cavity length of the laser was set to 300 μm, and the modulator length was set to 100 μm. The oscillation wavelength and the relationship of the propagation constant between the part of the InGaAsAl active layer 108 and the DBR mirror unit 107 are similar to those in the first embodiment. The design of the monolithic integrated lens 112 is also similar to that in the first embodiment. With this structure, also in the electro-absorption modulator-integrated DFB horizontal cavity surface emitting laser, the structure supporting the wafer-level inspection was realized.

[Fifth Embodiment]

Figure 6A:
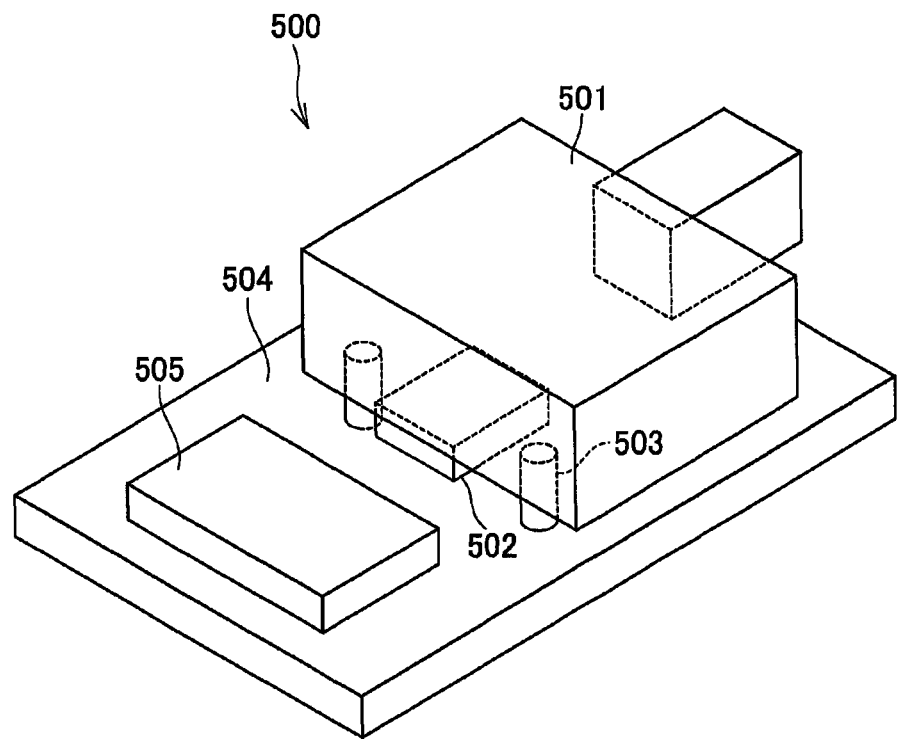
FIG. 6A is a surface birds-eye view of a small-sized optical module according to a fifth embodiment of the present invention.
Figure 6B:
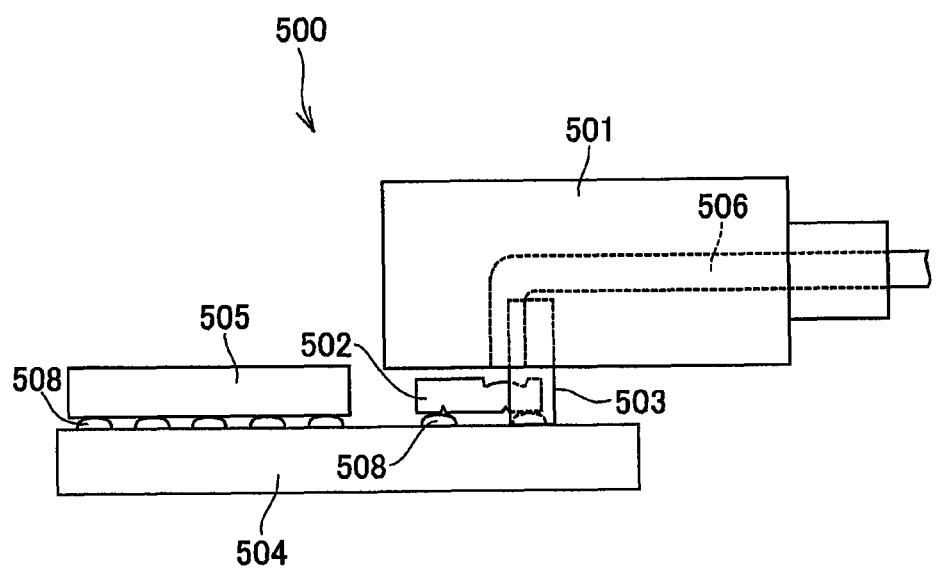
FIG. 6B is a side view of the small-sized optical module according to the fifth embodiment of the present invention.

With reference to FIGS. 6A and 6B, a small-sized optical module 500 according to a fifth embodiment of the present invention is described. FIG. 6A is a birds-eye view of the small-sized optical module 500, and FIG. 6B is a side view of the small-sized optical module 500. In the module of this embodiment, on a multi-layer wiring ceramic board 504 including a strip line, a multi-wavelength horizontal cavity surface emitting laser chip 502 and an integrated circuit 505 are mounted by establishing electrical connection through gold bumps 508. The multi-wavelength horizontal cavity surface emitting laser chip 502 is obtained by cutting out the horizontal cavity surface emitting laser device 100 of the first embodiment in a one-dimensional 4-channel array shape. The integrated circuit 505 is configured to drive the laser. Above the multi-wavelength horizontal cavity surface emitting laser chip 502, a fiber array connector 501 is mounted by a connector supporting column 503 at a position that enables optimal light coupling. Four 90°-bent MMFs are mounted on the fiber array connector 501 so that the fiber light receiving surface and the light emitting surface of the laser chip are placed at positions that enable optimal light coupling.

With use of this small-sized optical module 500, a signal of 25 Gbps per channel, that is, 100 Gbps in total was able to be transmitted through wavelength multiplexing. As described above, by using the laser array to which the present invention was applied, a small-sized and low-cost multi-channel optical module was manufactured, which was suitable for use in a router device.

As described above, according to the horizontal cavity surface emitting laser device of each embodiment described above, a highly reflective structure or an antireflective structure, which has been provided in the related art by. a dielectric film formed on a cleaved end surface, can be integrated in a wafer process. Therefore, the laser manufacturing process is ended only through the wafer process, which enables wafer-level inspection. Further, because the cleaved surface is not utilized, a precise cleaving step is unnecessary, which enables forming a chip through dicing. With this, the thickness of the chip, which corresponds to the distance from the light emitting point to the lens, can be freely designed, and thus a new effect of significantly increasing the degree of freedom in lens design is obtained. Further, when a highly reflective or antireflective film is formed on the end surface, peeling of those films may be one of factors of reliability deterioration. However, the end surface film is unnecessary in the present invention, and hence such a deterioration factor can be removed. As described above, with use of the present invention, it is possible to provide the horizontal cavity surface emitting laser device that enables wafer-level inspection before cutting the wafer. Therefore, the horizontal cavity surface emitting laser device according to each embodiment can suppress the inspection cost and have sufficient output characteristics.

Further, as described above, the horizontal cavity surface emitting laser device achieves surface emission by arranging an optical path converting mirror at an emission end surface of the horizontal cavity edge emitting laser. Therefore, when the highly reflective structure or the antireflective structure and the optical path converting mirror of the present invention are used, in principle, all of the horizontal cavity edge emitting lasers can be configured to support the wafer-level inspection.

Further, as the horizontal cavity in the above-mentioned horizontal cavity surface emitting laser device, other horizontal cavities can be used, such as a wavelength tunable horizontal cavity including a wavelength tunable unit. The modulator may be a Mach-Zehnder modulator.

While there have been described what are at present considered to be certain embodiments of the invention, it will be understood that various modifications may be made thereto, and it is intended that the appended claims coverall such modifications as fall within the true spirit and scope of the invention.

What is claimed is:

1. A horizontal cavity surface emitting laser device, comprising:
   a semiconductor substrate;
   an active layer disposed over one surface of the semiconductor substrate to generate light which is emitted in one direction along the one surface of the semiconductor substrate and in another direction opposite to the one direction;
   a rear distributed Bragg reflector unit disposed at an end of the active layer in the one direction to reflect the light emitted from the active layer, the rear distributed Bragg reflector unit including a waveguide layer to guide light and a distributed Bragg reflector configured to reflect the light in the waveguide layer;
   a rear reflecting mirror disposed over the one surface side to guide, in a direction different from the one direction and the other direction, the light emitted from an end of the rear distributed Bragg reflector unit in the one direction to prevent the light guided in the one direction from returning to the active layer;
   a front reflecting mirror disposed over the one surface side to reflect the light emitted from the active layer in the other direction toward another surface side of the semiconductor substrate;
   a condenser lens disposed over the other surface of the semiconductor substrate to condense the light reflected by the front reflecting mirror;
   an antireflective film disposed on the other surface of the semiconductor substrate, the antireflective film being integrally formed in a region spreading over the condenser lens and a position through which the light emitted from the rear reflecting mirror passes, and being made of a dielectric material;
   a p-type electrode and an n-type electrode disposed on the one surface of the semiconductor substrate; and
   a window structure disposed between the rear distributed Bragg reflector unit and the rear reflecting mirror, wherein the rear reflecting mirror guides the light emitted from the end of the rear distributed Bragg reflector unit in the one direction toward the other surface side of the semiconductor substrate.

2. The horizontal cavity surface emitting laser device according to claim 1, wherein the horizontal cavity surface emitting laser device comprises a distributed feedback laser in which a diffraction grating is integrated in a layer different from the active layer at a position overlapping with the active layer in plan view.

3. The horizontal cavity surface emitting laser device according to claim 1, further comprising:
   an emission-side distributed Bragg reflector unit disposed at an end of the active layer in the other direction, the emission-side distributed Bragg reflector unit including a waveguide layer and a distributed Bragg reflector.

4. The horizontal cavity surface emitting laser device according to claim 1, further comprising:
   a modulator disposed at another end of the active layer opposite from the rear distributed Bragg reflector unit to modulate light emitted from the active layer in the other direction.

5. The horizontal cavity surface emitting laser device according to claim 4, wherein the modulator comprises an electro-absorption modulator.

6. The horizontal cavity surface emitting laser device according to claim 4, wherein the modulator is a Mach-Zehnder modulator.

7. The horizontal cavity surface emitting laser device according to claim 1, further comprising:
   a wavelength tunable unit configured to change a wavelength of the emitted light.

8. The horizontal cavity surface emitting laser device according to claim 1, wherein a cladding layer comprises the front reflecting mirror and the rear reflecting mirror, and the cladding layer covers the active layer, the waveguide layer, and the rear distributed Bragg reflector unit.

* * * * *